United States Patent [19]

Tseng

[11] Patent Number: 5,824,582
[45] Date of Patent: Oct. 20, 1998

[54] STACK DRAM CELL MANUFACTURING PROCESS WITH HIGH CAPACITANCE CAPACITOR

[75] Inventor: Horng-Huei Tseng, Hsinchu, Taiwan

[73] Assignee: Vanguard International Semiconductor Corporation, Hsin-Chu, Taiwan

[21] Appl. No.: 868,607

[22] Filed: Jun. 4, 1997

[51] Int. Cl.$^6$ .............................................. H01L 21/8242
[52] U.S. Cl. .......................................... 438/254; 438/397
[58] Field of Search .................................... 438/238, 239, 438/253–256, 381, 396–399

[56] References Cited

U.S. PATENT DOCUMENTS

| 5,217,914 | 6/1993 | Matsumoto et al. | 438/254 |
| 5,403,767 | 4/1995 | Kim | 437/52 |
| 5,453,633 | 9/1995 | Yun | 257/306 |
| 5,491,103 | 2/1996 | Ahn et al. | 437/52 |
| 5,677,221 | 10/1997 | Tseng | 438/254 |
| 5,677,223 | 10/1997 | Tseng | 438/254 |

*Primary Examiner*—Jey Tsai
*Assistant Examiner*—Joni Y. Chang
*Attorney, Agent, or Firm*—George O. Saile; Stephen B. Ackerman

[57] ABSTRACT

A method is disclosed for a manufacturing process of forming a high capacitance capacitor in a DRAM cell. A semiconductor substrate having a switching MOS transistor comprising a word line and a bit line is provided. A first dielectric is deposited over the substrate and planarized. Contact hole is etched in the first dielectric until the substrate is exposed. A doped first polysilicon is blanket deposited over the substrate filling the holes. A trench is next formed partially in the first polysilicon layer over the contact hole but not reaching the hole. A second dielectric material is deposited over the substrate filling the trench. The dielectric layer is then plasma etched back so as to form a dielectric plug in the trench. Using now the dielectric plug as a mask, the first polysilicon layer is then removed to a predetermined thickness by means of reactive ion etch. A second polysilicon is next formed conformally over the first polysilicon layer covering the dielectric plug. Subsequently, the second polysilicon is etched back so as to form a (second) polysilicon spacer around the dielectric plug. Finally, the dielectric plug is removed to leave behind a hollow trench with second polysilicon walls and first polysilicon base. The storage electrode is completed by covering the resulting structure with a third conformal dielectric and then filling with a third polysilicon. The plate of the capacitor is formed by patterning the third polysilicon.

19 Claims, 5 Drawing Sheets

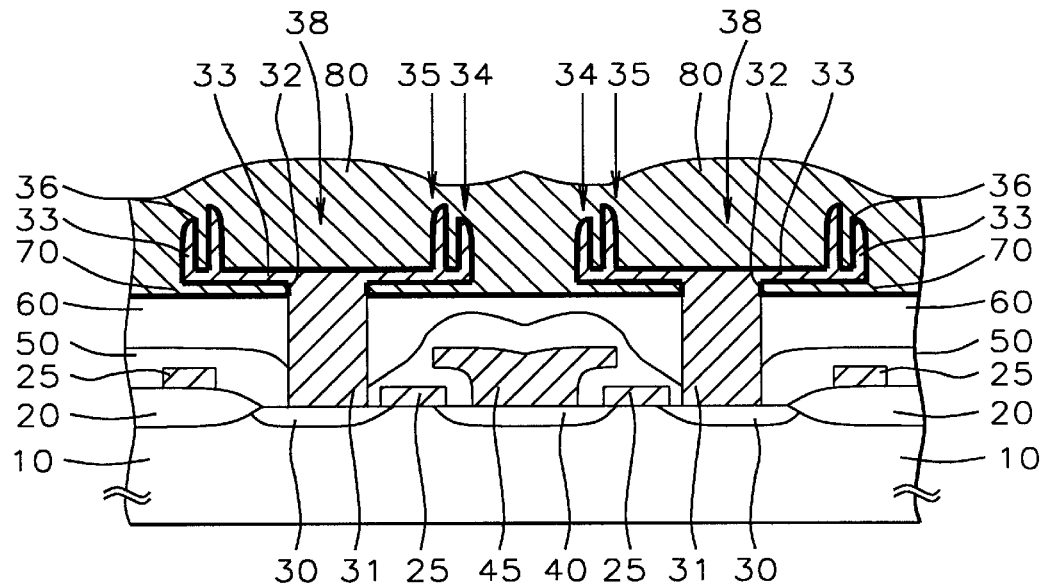
FIG. 1 – Prior Art
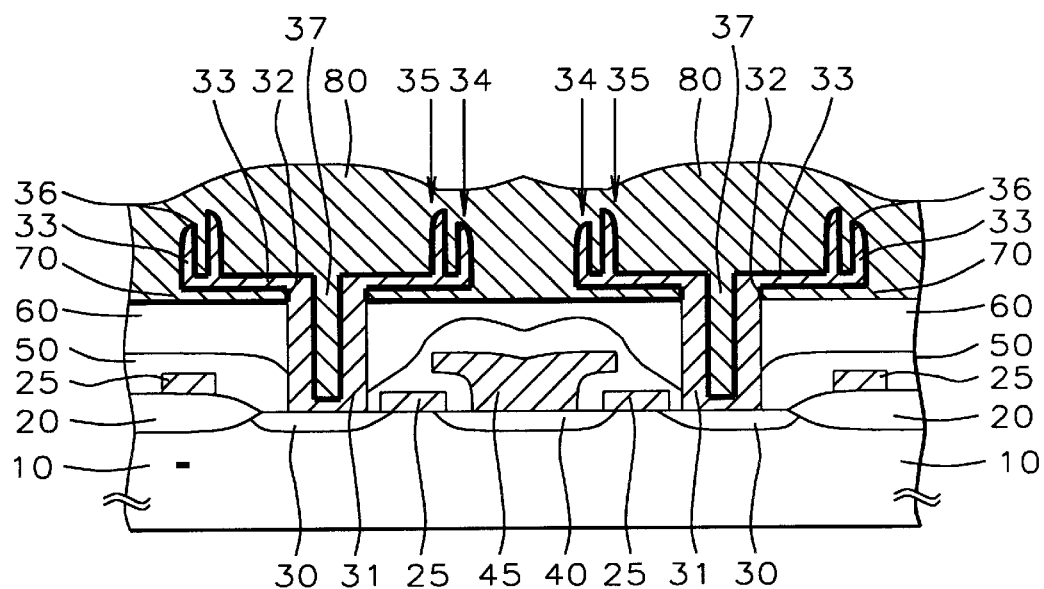
FIG. 2 – Prior Art

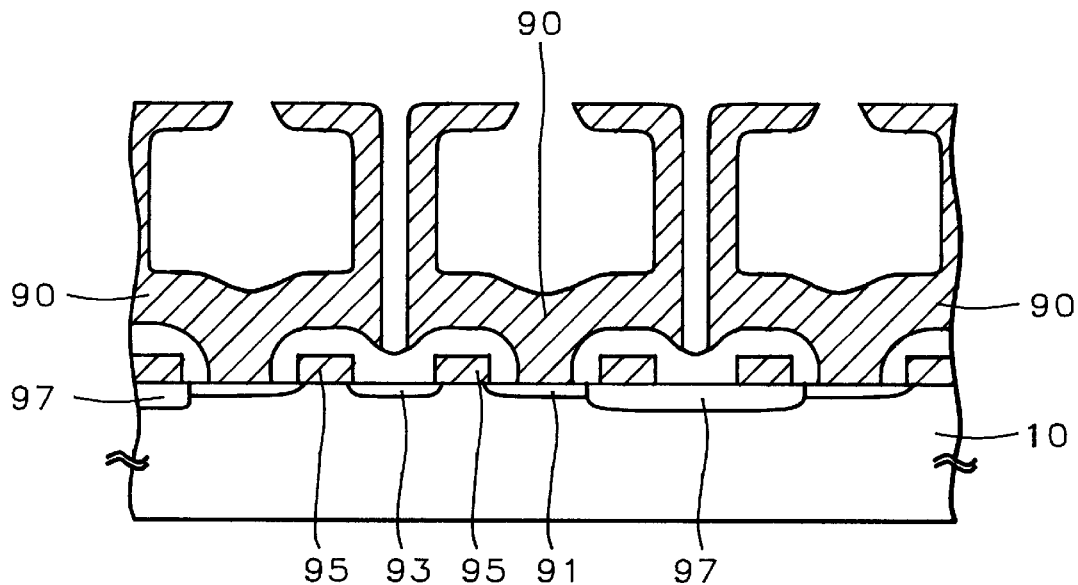
FIG. 3 – Prior Art
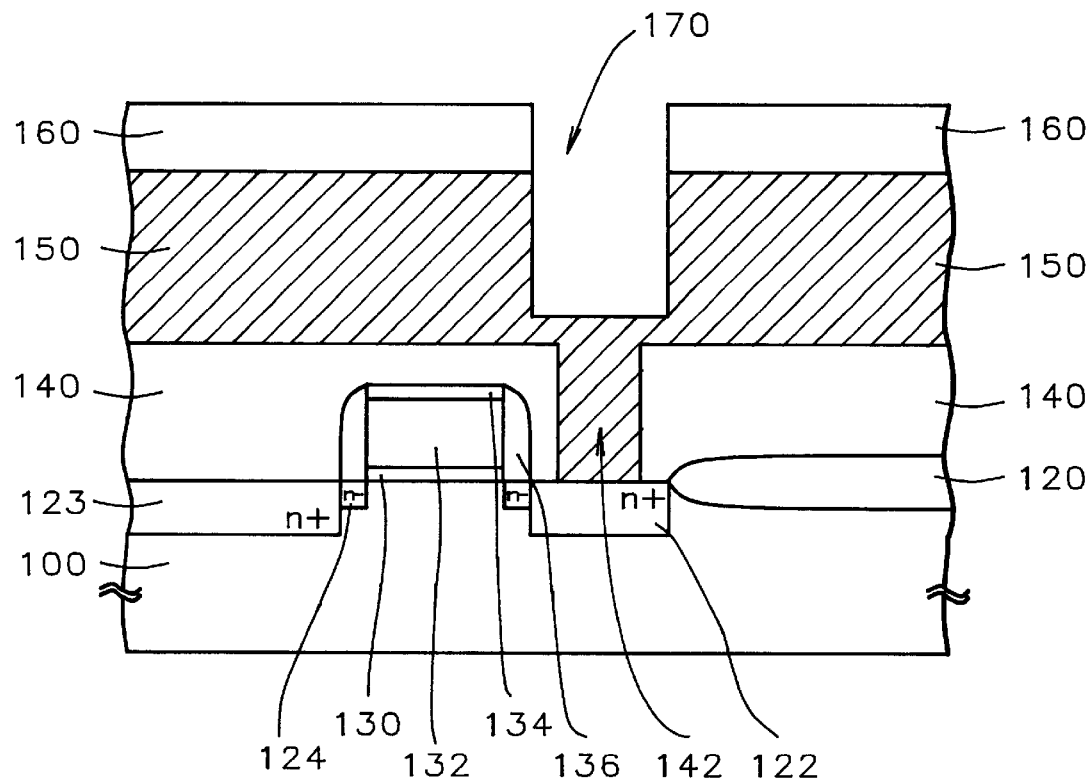
FIG. 4

STACK DRAM CELL MANUFACTURING PROCESS WITH HIGH CAPACITANCE CAPACITOR

BACKGROUND OF THE INVENTION (1) Field of the Invention

The present invention relates generally to semiconductor memory devices and more particularly to a method of manufacturing a high capacitance storage electrode for high density DRAMs.

(2) Description of the Related Art

A DRAM is a dynamic random access memory device having memory cells comprising a storage capacitor and a gate transistor and is used to store digital information. Memory cells are usually arranged on a semiconductor substrate in a matrix arrangement and each one is individually selected by means of a two dimensional addressing system. The information is stored in and retrieved from the storage capacitor through a bit line (data line) that is connected via a transistor.

Over the years, as the DRAM devices have been scaled down in size, the minimum amount of stored charge needed to maintain reliable memory operation has remained the same. This constant charge-storage value has to be maintained for future DRAM generations as well even as the cell sizes shrink even further. As is well known in the art, the storage capacity of capacitors in memory cells can be increased by making the capacitor dielectric thinner, by using an insulator with a larger dielectric constant, or by increasing the area of the capacitor. The third option of increasing the capacitor area can be effective and has been exploited in certain different ways. One way is to form three-dimensional structures in place of planar capacitors. In this approach, the storage capacitor is formed in a trench etched in a semiconductor substrate. The silicon-area reduction of a trench capacitor compared to a planar capacitor can be a factor of eighteen or more, for example. Alternatively, the storage capacitor of a cell can be formed, or stacked, on top of its access transistor, thereby shrinking the cell size without a loss of its storage capacity. In still another approach, a three-dimensional effect can be realized by forming a finned structure with leaves extending from the same capacitor trunk. Many variations of such three-dimensional capacitors are reported in prior art.

General usage of trench structures are well known in isolation technology where they are used to isolate devices in integrated circuits. There are differences in these structures, however, when they are used for DRAM capacitors, in particular. As stated earlier, storage capacity is inversely proportional to the dielectric thickness, and therefore, in the case of a trench capacitor, the dielectric film on the walls of the trench must be much thinner than on the walls of an isolation trench. Also, since polysilicon is usually used as the filler material in the trench, and since in the case of a trench capacitor this material also serves as one plate of the capacitor, it must consist of highly doped polysilicon. Usually the semiconductor on the other side of the thin dielectric serves as the other capacitor plate. The role of the polysilicon inside the trench as the storage electrode or plate electrode will vary depending upon the particular design used.

Similar considerations as in trench-capacitors apply when three-dimensional capacitors are formed above the access transistors on a semiconductor substrate. In prior art, some of these structures are referred to as stacked capacitors (STCs). As usual, the properties of the dielectric, and the area of the capacitor play a significant role in determining the storage capacity. Thus, for STC cells to be made feasible for high-density DRAMs of 1 Megabit and beyond, an insulator with a larger dielectric constant than that of $SiO_2$ must be made available, or novel structures must be developed. In the absence of the former presently, several novel STC cells have been reported in the literature.

A relatively recent STC is a three-dimensional finned structure forming a multiple wall capacitor which is shown in FIG. 1. Different methods of manufacturing essentially the same structure are disclosed in various patents. A conventional method of forming such a capacitor follows the steps described by Ahn, et al, for example, in U.S. Pat. No. 5,491,103. Following Ahn, but without going into unnecessary details so as to not obscure the main features of forming three-dimensional capacitors, it is sufficient to note in FIG. 1 the fin-like structure (38) and its formation as follows: first, an active region in a semiconductor substrate (10) is isolated from other active regions by forming field oxide regions (20) using commonly practiced isolation methods such as LOCOS (local oxidation of silicon). Subsequently, transistors having a source (30) and drain (40) regions, and a gate electrode (25) and commonly shared bit line (45) are formed in the active region using again common semiconductor manufacturing methods such as deposition, photolithography, and ion-implantation. The structure so formed is then conformally deposited with an insulating layer (50), and is further covered by still another insulating layer (60), which can then be planarized to form a flat surface on the substrate. An etch-blocking layer (70, such as silicon nitride ($Si_3N_4$) is next deposited over the planarized surface.

The forming of structure (38) begins by forming a contact hole (31) over the source region (30). This is accomplished by etching holes through a patterned photoresist layer (not shown) formed on the flat planarized surface indicated earlier. This is accomplished by partially removing the etch-blocking layer (70), planarizing layer (60) and insulating layer (50). Contact hole (31) is next filled with a conductive material such as an impurity-doped polysilicon and etched back to form a columnar base for connecting the three-dimensional capacitor (38) to source region (30).

The three-dimensional structure (38) itself is formed through various process steps of depositing and removing layers. In U.S. Pat. No. 5,491,103, silicon oxide is thickly deposited over the planarized surface of the previous process step and patterned to form holes corresponding to and over the columnar base (31) in FIG. 1. The holes so formed are larger than the diameter of the columnar base (31) such that, in one embodiment, the outer wall of the hole forms the fin-like protrusion (34). The hole is then conformally deposited with a second polysilicon to from extension arms (33) as shown in FIG. 1. At this step, a single walled (34) capacitor is formed. And following the methods of prior art, the surfaces of the capacitor may now be covered with an oxide layer (36) and then deposited with a third polysilicon (80) to form a plate electrode of the capacitor, thereby completing the capacitor structure of the DRAM.

In other embodiments, multiple walls or fins are formed as shown in FIG. 1. It will be known to those skilled in the art that oxide spacers are commonly used in between the fins to form a multiplicity of the same. In U.S. Pat. No. 5,491,103 a quadruplet fin structure is disclosed using the spacer technique and much larger capacitor area is gained therefrom. Still other techniques are employed to gain even more capacitor area. In U.S. Pat. No. 5,453,633, the columnar base (31) is etched to form inside wall (37) as shown in FIG.

2. On the other hand, Kim in U.S. Pat. No. 5,403,767 discloses a method of forming jar-like structures (90) shown in FIG. 3 for the purpose of having capacitors with large area, and hence large capacitance. Here, active region comprising drain (91), source (93), gate (95) is isolated with field oxide region (97) as shown in the same Figure.

In the present invention, an inverse method is disclosed where in place of oxide spacers, polysilicon spacers are used to form large area capacitors. It will be appreciated by those skilled in the art that the method disclosed later more readily lends itself to the manufacture of high capacitance, high packing density integrated circuits.

SUMMARY OF THE INVENTION

It is therefore an object of this invention to provide a manufacturing process for forming a three-dimensional capacitor.

It is another object of this invention to provide a high capacitance capacitor by maximizing the surface area of storage electrode.

It is a further object of the present invention to provide a highly integrated stacked DRAM cell with high packing density.

These objects are achieved by providing a semiconductor substrate having a switching MOS transistor comprising a word line and a bit line. A first dielectric is deposited over the substrate and planarized. Contact holes are etched in the first dielectric until the substrate is exposed. A doped first polysilicon is blanket deposited over the substrate filling the holes. A trench is next formed partially in the first polysilicon layer over the contact hole but not reaching the hole. A second dielectric material is deposited over the substrate filling the trench. The dielectric layer is then plasma etched back so as to form a dielectric plug in the trench. Using now the dielectric plug as a mask, the first polysilicon layer is then removed to a predetermined thickness by means of reactive ion etch. A second polysilicon is next formed conformally over the first polysilicon layer covering the dielectric plug. Subsequently, the second polysilicon is etched back so as to form a (second) polysilicon spacer around the dielectric plug. Finally, the dielectric plug is removed to leave behind a hollow trench with second polysilicon walls and first polysilicon base. The storage electrode is completed by covering the resulting structure with a third conformal dielectric and then filling with a third polysilicon. The plate of the capacitor is formed by patterning the third polysilicon.

BRIEF DESCRIPTION OF THE DRAWINGS

FIG. 1 is a cross-sectional view of a semiconductor substrate showing a multiple fin-like structure of a storage electrode of prior art.

FIG. 2 is a cross-sectional view of a semiconductor substrate showing an additional surface area for the multiple fin-like structure of FIG. 1 of prior art.

FIG. 3 is a cross-sectional view of a semiconductor substrate showing a jar-like extended surface area for a storage electrode of prior art.

FIG. 4 is a cross-sectional view of a semiconductor substrate showing the forming of a stacked trench in a first polysilicon layer according to this invention.

DESCRIPTION OF THE PREFERRED EMBODIMENTS

Figure 5:
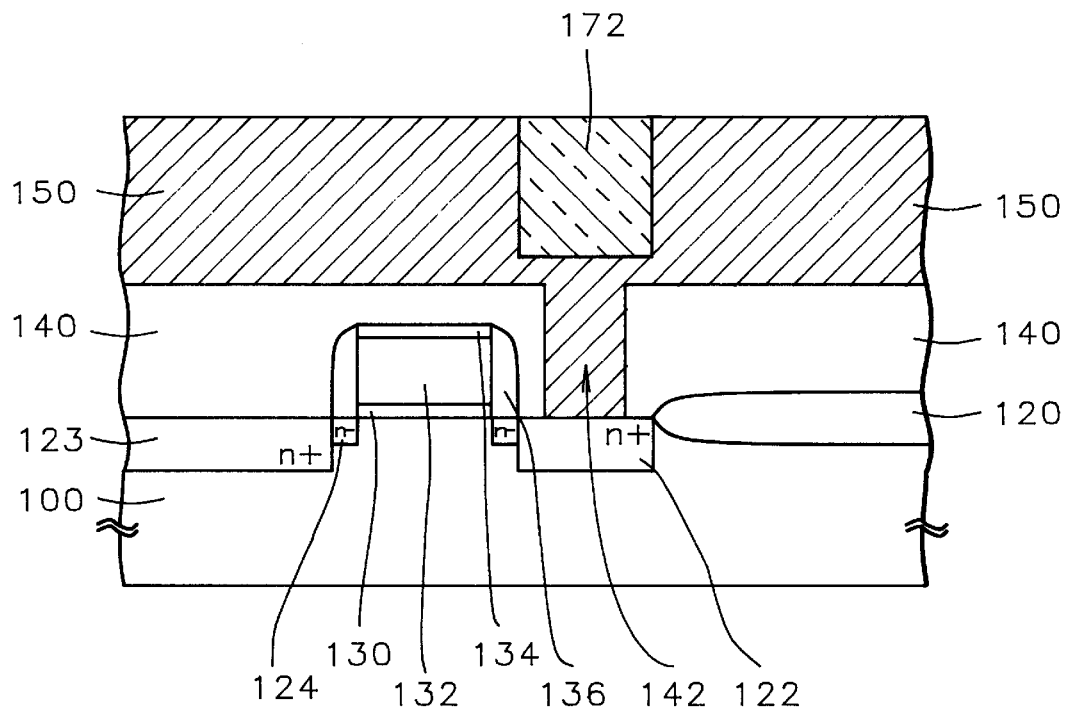
FIG. 5 is a cross-sectional view showing the filling of trench of FIG. 4 with a dielectric material according to this invention.

Referring now to the drawings, more particularly to FIGS. 4 through 10, there is illustrated a method for forming a three-dimensional, high surface area storage electrode for a high density, stacked capacitor in a DRAM cell. In FIG. 4, a silicate substrate (100) having an active region comprising source (122) drain (123) along with lightly doped drain (124) and isolated with field oxide (120) is provided with gate oxide (130), gate electrode (132) employing methods well known in the art of semiconductor manufacturing. Gate oxide (130) is preferred to have a thickness between about 400 to 600 angstroms (Å). Sidewalls of gate (132) are formed with oxide spacers (136) and the top of the gate is capped with an oxide layer (134) having a thickness between about 600 to 800 (Å), thus forming a part of the MOS device on substrate (100) in FIG. 4.

In the preferred embodiment, the device shown in FIG. 4 is covered with a layer of first dielectric undoped oxide (140) to a thickness between about 3000 to 8000 Å. Layer (140) is formed by performing a low temperature plasma enhanced chemical vapor deposition (PECVD), or low pressure LPCVD, employing a gas mixture comprising $SiH_4+N_2O$, or $Si(C_2H_5)_4O_2$. It will be understood, however, that first dielectric (140) can comprise a composite layer also, such as nitride and BPSG or undoped oxide and BPSG. The first dielectric so formed is planarized and patterned to form cell contact hole (142) using methods well known in the art.

Subsequently, a layer of doped first polysilicon (150) is deposited over substrate (100) with a thickness between about 3000 to 8000 Å, thereby completely filling contact hole (142) such that full contact is established between the first polysilicon and the exposed silicon substrate at the bottom of the hole.

A layer of photoresist (160), of thickness between about 8,000 to 12,000 Å, is next deposited over first polysilicon layer (150) and then patterned to have openings larger than—and over areas corresponding to—the underlying contact hole (142) as shown in FIG. 4. A trench (170) of a depth between about 2000 to 7000 Å is then formed by etching first polysilicon layer (150) anisotropically using recipe comprising $HBr+SF_6+Cl_2+O_2$.

Figure 6:
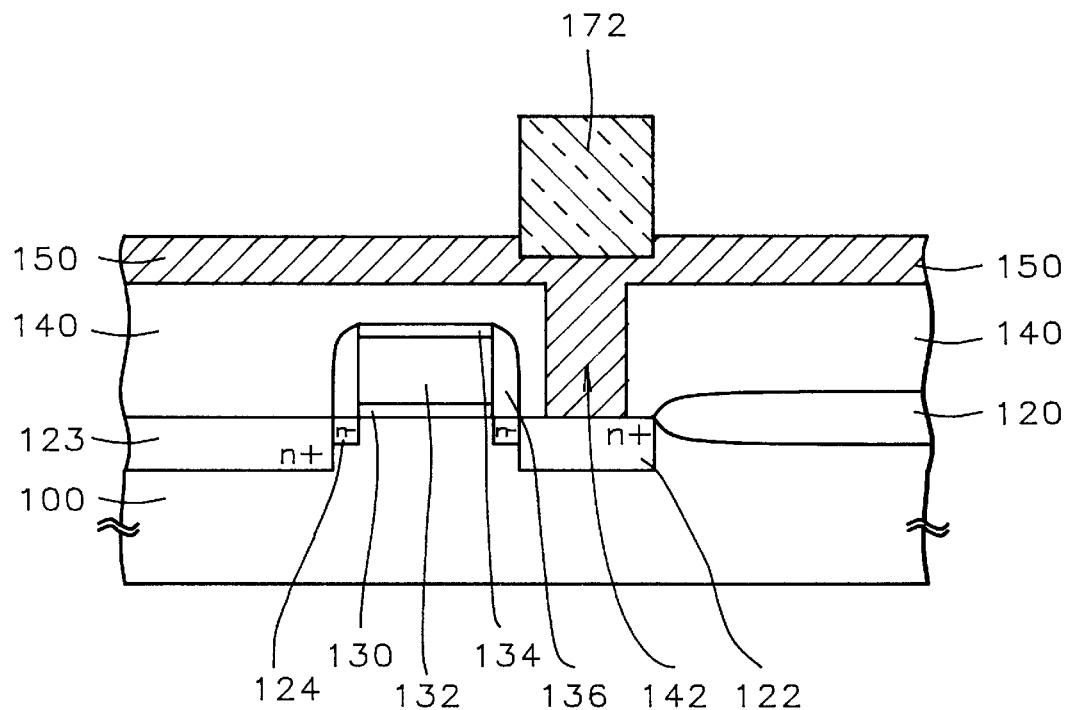
FIG. 6 is a cross-sectional view showing the forming of a plug of the dielectric in the trench of FIG. 5, according to this invention.

After removal of the photoresist, a second dielectric is formed over the first polysilicon layer covering the substrate to fill the trench completely and more. It is preferred that the dielectric is undoped oxide or tetraethyl orthosilicate (TEOS) oxide formed by thermal CVD, though it will be understood that doped oxide can also be used, and that it is plasma etched back using recipe comprising $CHF_3+Ar+O_2$ to form oxide plug (172) as shown in FIG. 5. Mechanical chemical polishing (CMP) is also suitable for removing the second dielectric, planarizing the surface of the substrate and forming the plug in the trench. The remaining layer of first polysilicon layer is next removed by timed reactive ion etching it while using the oxide plug as a mask. This is accomplished with recipe comprising $HBr+SF_6+Cl_2+O_2$. The resulting structure is as shown in FIG. 6.

Figure 7:
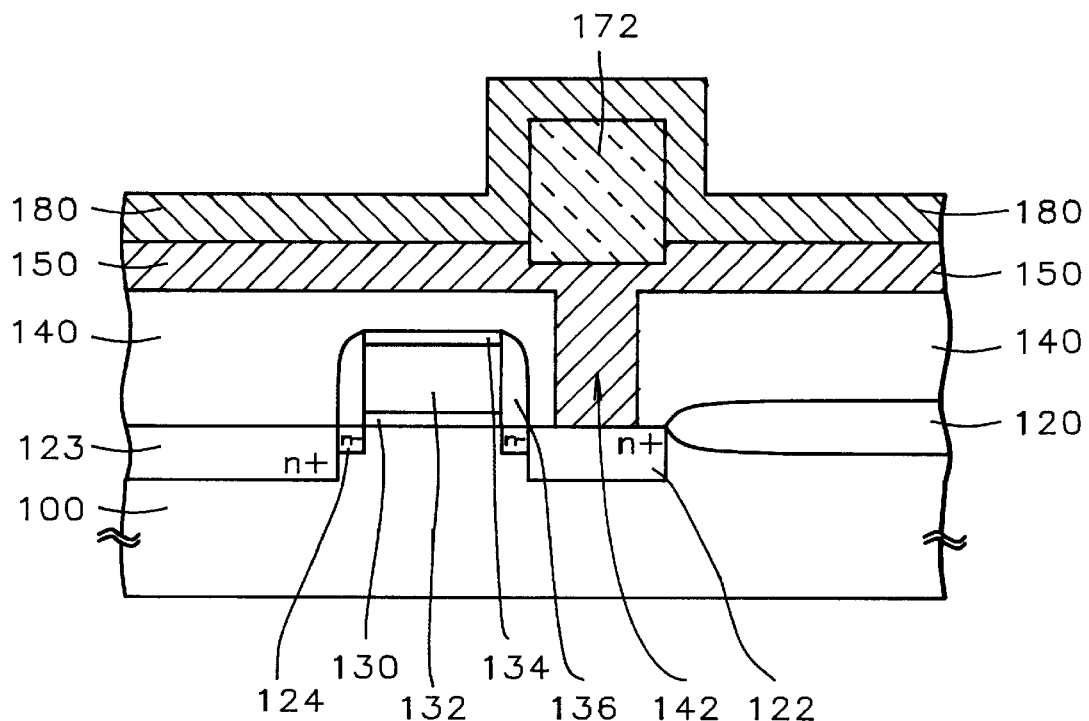
FIG. 7 is a cross-sectional view showing the covering of the plug of FIG. 6 with a second polysilicon layer according to this invention.
Figure 8:
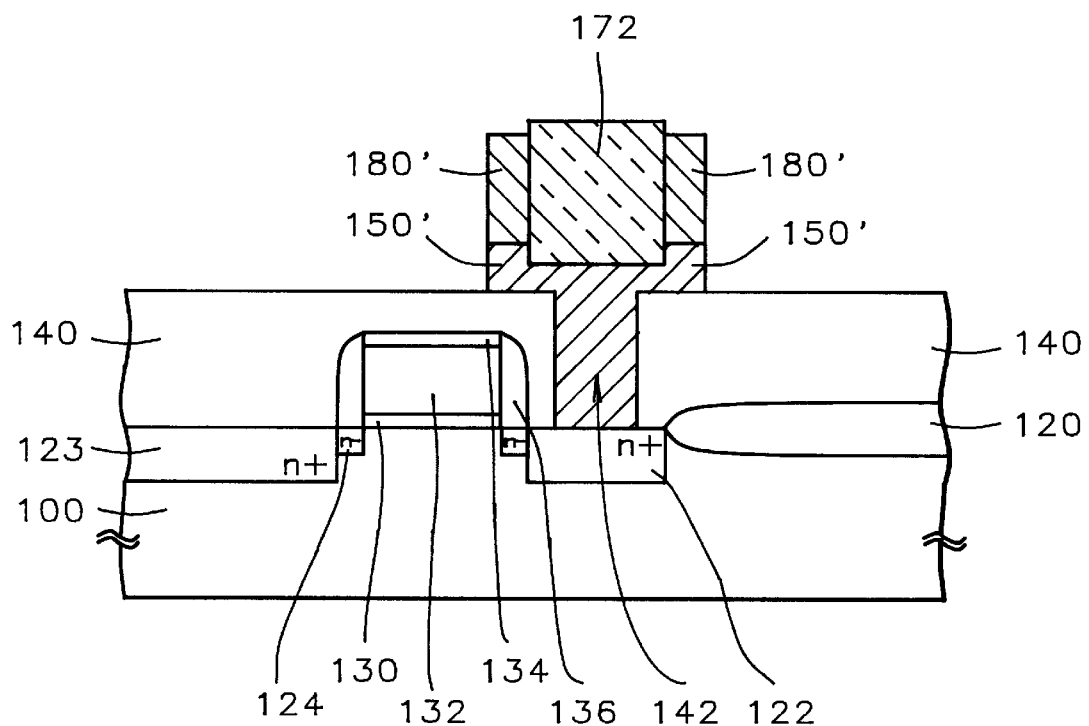
FIG. 8 is a cross-sectional view showing the forming of polysilicon spacers around the plug of FIG. 7, according to this invention.

A thin layer of doped second polysilicon (180) with a thickness between about 500 to 2000 Å is next deposited conformally over oxide plug (172) and on first polysilicon layer (150) as shown in FIG. 7. As a main feature and key aspect of the present invention, the second polysilicon layer (180) is then preferably etched back anisotropically etching recipe comprising $HBr+SF_6+Cl_2+O_2$ until first oxide plug is exposed. Unetched portions of second polysilicon at the vertical sidewalls of oxide plug (172) form the polysilicon spacers (80')of this invention.

Figure 9:
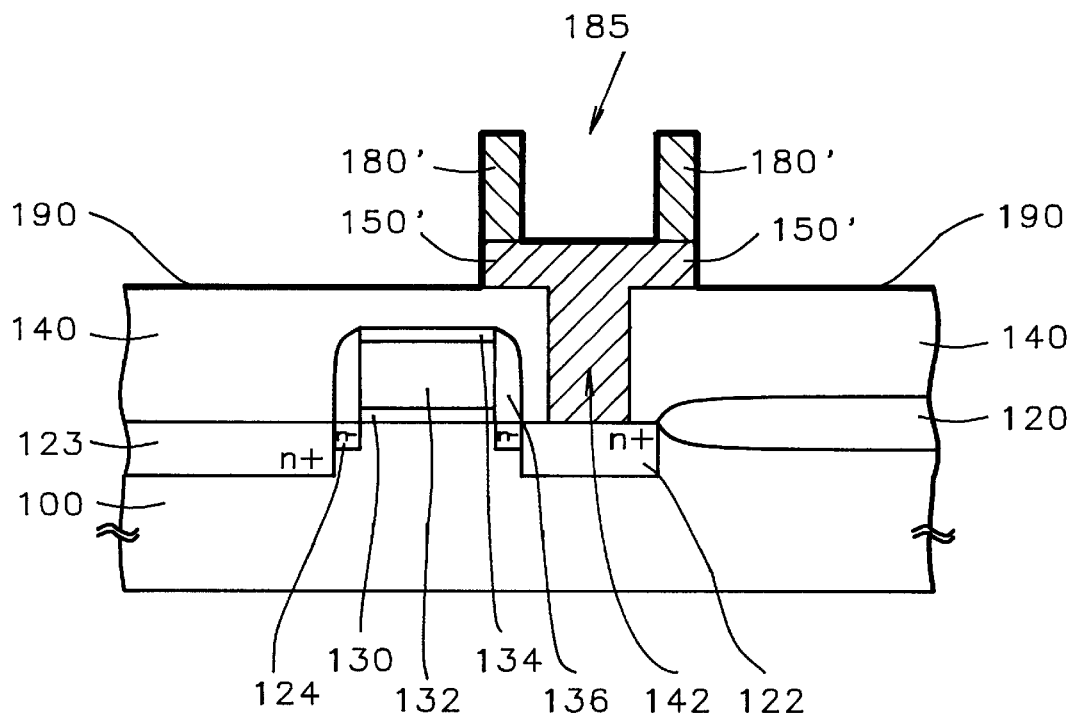
FIG. 9 is a cross-sectional view showing the forming of the storage electrode about the trench of FIG. 4 according to this invention.
Figure 10:
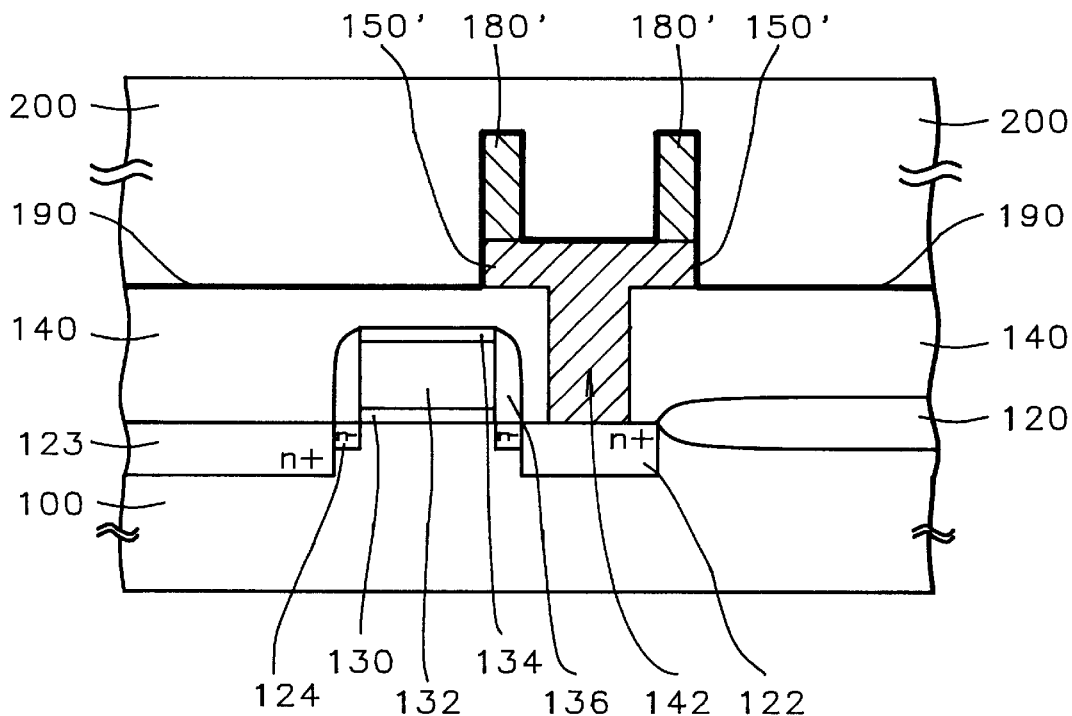
FIG. 10 is a cross-sectional view showing the forming of the top plate of the capacitor of FIG. 9, according this invention.

The next important step in this newly disclosed capacitor manufacturing process is the complete removal of the first dielectric oxide plug, thereby leaving a three-dimensional, hollow structure comprising large area walls (180') of second polysilicon and a base (150') of first polysilicon layer, as shown in FIG. 9. The removal of the plug is accomplished by using wet etch recipe comprising hydrofluoric (HF) solution.

It will be evident to those skilled in the art that the resulting structure (185) in FIG. 9 is a large storage electrode of the capacitor that can now be formed readily. This is accomplished by forming a third dielectric layer (190) over the entire surface of storage electrode, and then following it with the deposition of an impurity-doped third polysilicon to form a plate electrode (200). It is preferred that the third dielectric is a multilayered oxynitride ONO. NO or tantalum oxide ($Ta_2O_5$) capacitors may also be employed.

While the invention has been particularly shown and described with reference to the preferred embodiments thereof, it will be understood by those skilled in the art that various changes in form and details may be made without departing from the spirit and scope of the invention. A case in point is the shape of the trench which may be cylindrical or otherwise. Furthermore, a multiplicity of trenches or walls one inside the other, and attached to a common bottom can also be formed to form a storage electrode with much larger surface area by repeating the manufacturing process of the present invention.

What is claimed is:

1. A method of forming a stack direct random access memory DRAM cell with high capacitance capacitor comprising the steps of:

providing a semiconductor substrate having source, drain and field oxide regions formed therein;

forming a patterned gate oxide layer on said semiconductor substrate;

forming a gate electrode on said gate oxide layer;

forming a first dielectric layer over said semiconductor substrate wherein said first dielectric layer covers said gate electrode, and said source and drain regions;

patterning said first dielectric layer to form a hole;

depositing a first polysilicon layer over said dielectric layer on said semiconductor substrate to fill said hole;

depositing and patterning a layer of photoresist over first said first polysilicon layer;

etching through said layer of patterned photoresist to form a trench in said first polysilicon layer;

depositing a second dielectric layer over said first polysilicon layer to fill said trench;

removing partially said second dielectric layer to form a dielectric plug in said trench;

etching partially said first polysilicon layer;

depositing a second polysilicon layer over said partially etched first polysilicon layer;

etching back said second polysilicon layer to form polysilicon spacer adjacent to said trench;

removing said dielectric plug from said trench;

forming a third dielectric layer over said first polysilicon layer and said polysilicon spacer; and patterning a third polysilicon layer over said third dielectric layer to form said capacitor.

2. The method of claim 1, wherein said substrate is silicon.

3. The method of claim 1, wherein said gate oxide has a thickness between about 400 to 600 angstroms (Å).

4. The method of claim 1, wherein said gate electrode has oxide spacers adjacent to its sidewalls, and is covered with an oxide cap.

5. The method of claim 4, wherein said oxide cap has a thickness between about 600 to 800 Å.

6. The method of claim 1, wherein said first dielectric is undoped oxide with a thickness between about 3000 to 8000 Å.

7. The method of claim 6, wherein said undoped oxide is formed by performing a low temperature plasma enhanced chemical vapor deposition (PECVD) employing recipe comprising $SiH_4+N_2O$.

8. The method of claim 1, wherein said hole is a contact hole reaching to a surface of said substrate.

9. The method of claim 1, wherein said first polysilicon has a thickness between about 3,000 to 8,000 Å.

10. The method of claim 1, wherein said photoresist has a thickness between about 8,000 to 12,000 Å.

11. The method of claim 1, wherein said etching to form said trench is accomplished by an anisotropic recipe comprising $HBr+SF_6+Cl_2+O_2$.

12. The method of claim 1, wherein said trench has a depth between about 2,000 to 7,000 Å.

13. The method of claim 1, wherein said second dielectric is undoped oxide.

14. The method of claim 1, wherein said removing partially said second dielectric is accomplished by an etching recipe comprising $CHF_3+Ar+O_2$.

15. The method of claim 1, wherein said etching partially said first polysilicon layer is accomplished by recipe comprising $HBr+SF_6+Cl_2+O_2$.

16. The method of claim 1, wherein said second polysilicon has a thickness between about 500 to 2,000 Å.

17. The method of claim 1, wherein said etching back said second polysilicon layer is accomplished by an anisotropic etching recipe comprising $HBr+SF_6+Cl_2+O_2$.

18. The method of claim 1, wherein said removing said dielectric plug is accomplished with wet etch recipe comprising hydrofluoric solution.

19. The method of claim 1, wherein said third dielectric is an oxynitride.

* * * * *